United States Patent [19]
Nakamura et al.

[11] Patent Number: 5,711,413
[45] Date of Patent: Jan. 27, 1998

[54] FLAT TYPE IC CONVEYOR

[75] Inventors: Akio Nakamura; Tetsuya Okudaira; Yoshihiro Goto, all of Tokyo, Japan

[73] Assignee: Ando Electric Co., Ltd., Tokyo, Japan

[21] Appl. No.: 761,796

[22] Filed: Dec. 6, 1996

[30] Foreign Application Priority Data

Dec. 22, 1995 [JP] Japan .................................. 7-350577

[51] Int. Cl.⁶ .................................................. B65G 21/20
[52] U.S. Cl. .................................. 198/860.3; 198/860.5; 193/2 R
[58] Field of Search ................... 198/860.3, 860.5, 198/803.14, 836.1, 836.3; 193/2 R

[56] References Cited

U.S. PATENT DOCUMENTS 5,161,678 11/1992 Garvey .......................... 198/860.5 X
5,269,401 12/1993 Ito et al. .......................... 193/2 R X

FOREIGN PATENT DOCUMENTS

0169415 7/1986 Japan .............................. 193/2 R
0136409 6/1987 Japan .......................... 198/860.3
5-97238 4/1993 Japan .............................. 193/2 R
6-82583 11/1994 Japan.

*Primary Examiner*—James R. Bidwell
*Attorney, Agent, or Firm*—Flynn, Thiel, Boutell & Tanis, P.C.

[57] ABSTRACT

A flat type IC conveyor capable of conveying flat type ICs while stabilizing the posture of the ICs. A plurality of recess portions accommodating therein flat type ICs are formed lengthwise and widthwise on a flat type IC conveyor. Through holes are respectively defined in the bottom surfaces of the recess portions in a manner of avoiding leads of the ICs. Positioning pins are provided upright on the IC conveyor. A cover includes a plurality of convex portions which are positioned corresponding to the recess portions and direct to project toward package portions of the ICs to be accommodated in the recess portions. The cover also includes holes into which the positioning pins are inserted. When the cover is mounted on the conveyor, the convex portions can prevent the inclination of the ICs in the recess portions.

2 Claims, 8 Drawing Sheets

FLAT TYPE IC CONVEYOR

BACKGROUND OF THE INVENTION

1. Field of the Invention

The present invention relates to a flat type IC conveyor, particularly, this conveyor is used for an autohandler for conveying ICs horizontally and this conveyor is circulated in the autohandler.

2. Prior Art

An arrangement of a conventional IC conveyor will be now described with reference to FIG. 4 to FIG. 6.

Figure 4A:
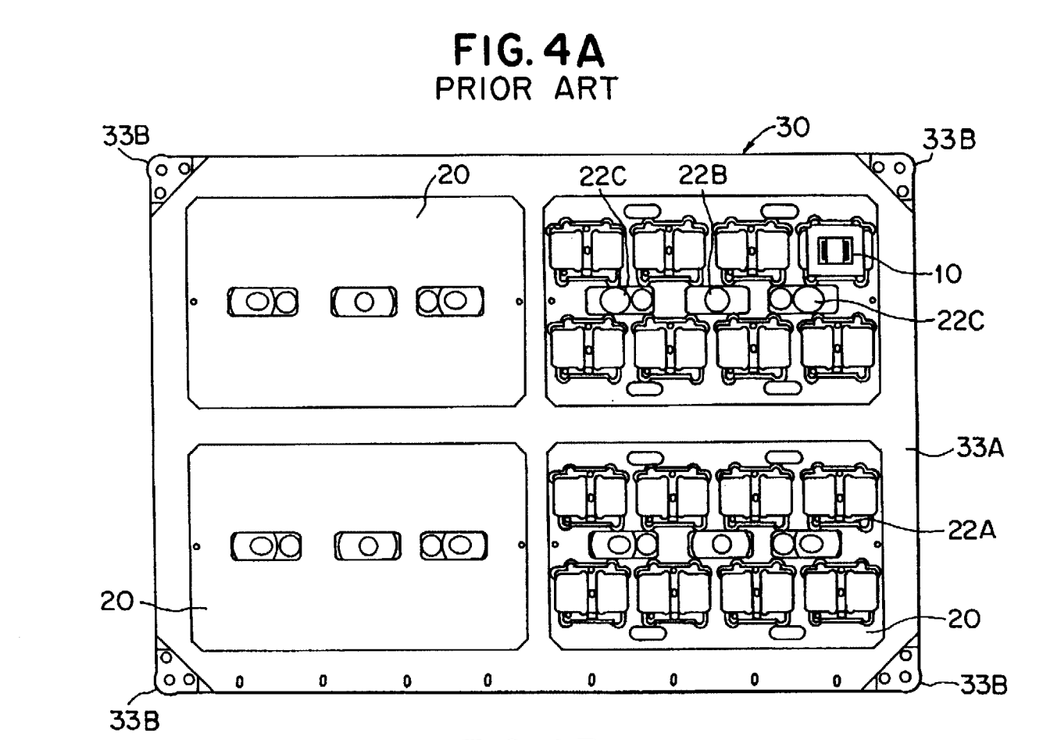
FIGS. 4A–4C are an arrangement showing a conventional IC conveyor.
Figure 4B:
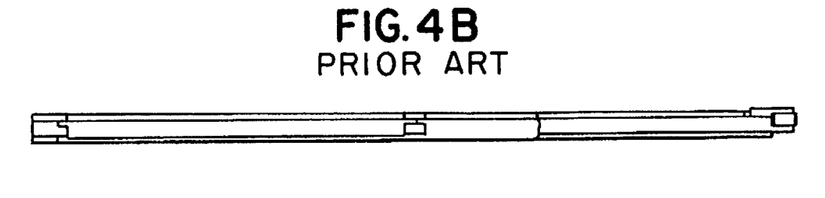
Figure 4C:
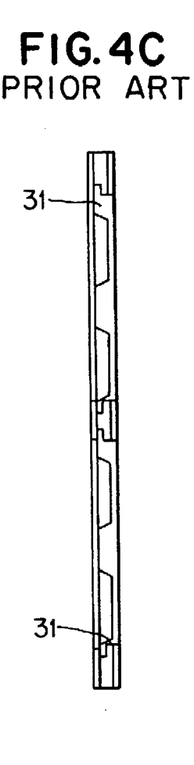

In FIG. 4 showing the arrangement of the conventional IC conveyor, denoted by 20 is an IC container, and 30 is an IC conveyor tray hereinafter, simply "conveyor 30".

Figure 5A:
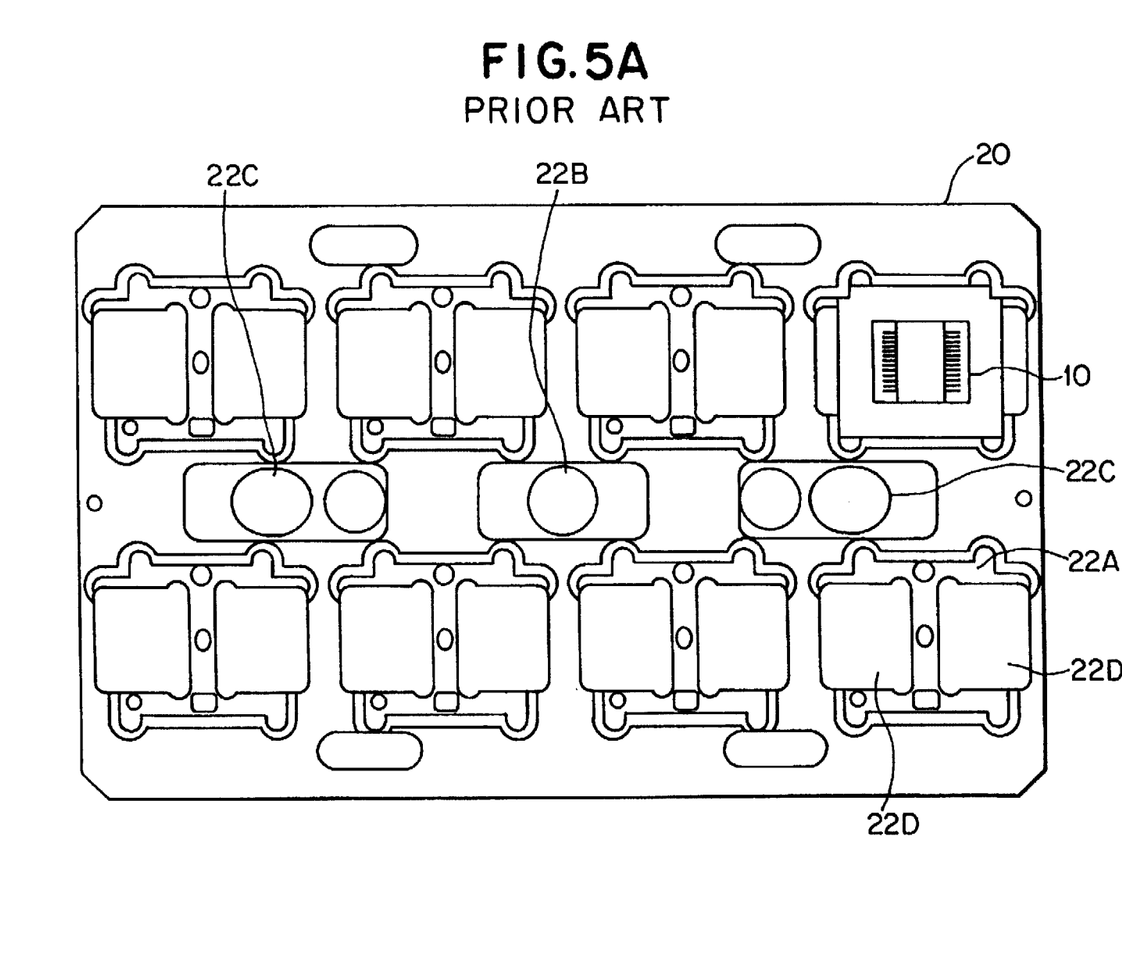
FIGS. 5A–5B are an external appearance of an IC container in FIG. 4.
Figure 5B:
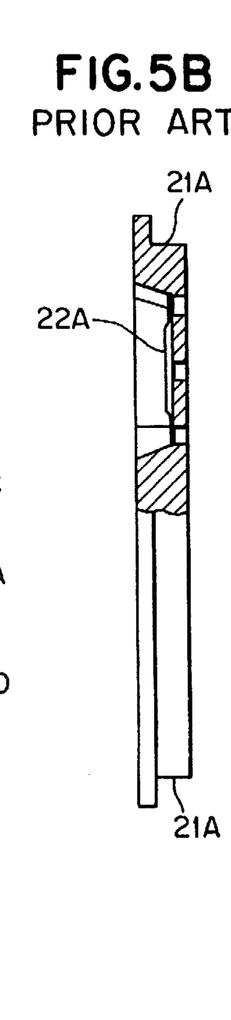

In FIG. 5 showing an external appearance of the IC container 20 having recess portions 22A, a standard hole 22B, and guide holes 22C. In FIG. 5, the IC container 20 can accommodate therein eight ICs 10 each having a lead frame. Each of the recess portions 22A is tapered so as to accommodate the IC 10. Each of the recess portions 22A has an escape hole 22D bored therein through which a contact of each of IC sockets 4 is escaped. Two elliptical guide holes 22C are bored in the IC container 20 along the same longitudinal line as the center of the standard hole 22B, and they are guided by guide pins 55B of a measuring board 50, described later. The reason why the guide hole 22C has an elliptical shape is that the IC container 20 can be retained by the measuring board 50 under high and low temperature conditions considering the extension and contraction of the IC container 20 caused by the change of temperature. Stages 21A are formed at both side surfaces of the IC container 20 in the longitudinal direction thereof.

In FIG. 4, four IC containers 20 are arranged lengthwise and widthwise. In FIG. 4, recess portions 31 to be mounted on the stages 21A of each IC container 20 are formed in the IC conveyor 30, and an upper surface of the IC conveyor 30 is covered with a cover 33A. In FIG. 4, each of the IC containers 20 is supported by the IC conveyor 30 to be horizontally freely movable on the IC conveyor 30. Still further, rollers 33B are provided at four corners of the IC conveyor 30 so as to smoothly move the IC conveyor 30.

Figure 6A:
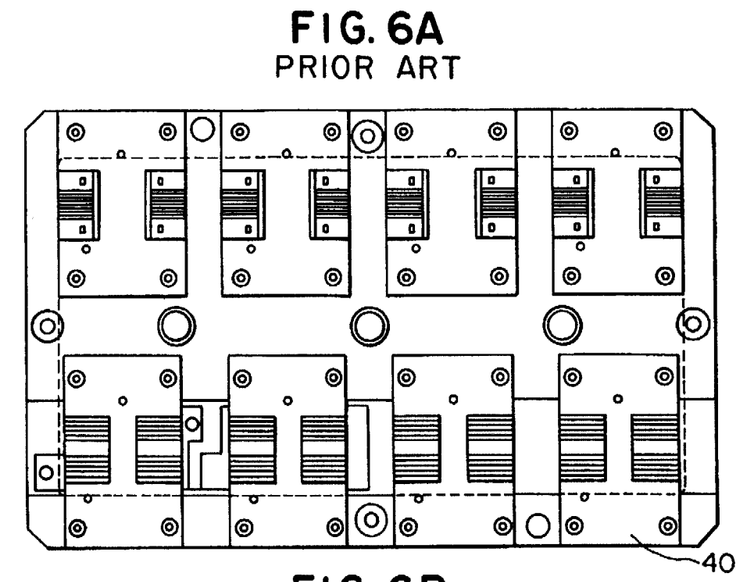
FIGS. 6A–6C are an external appearance of a measuring board.
Figure 6B:
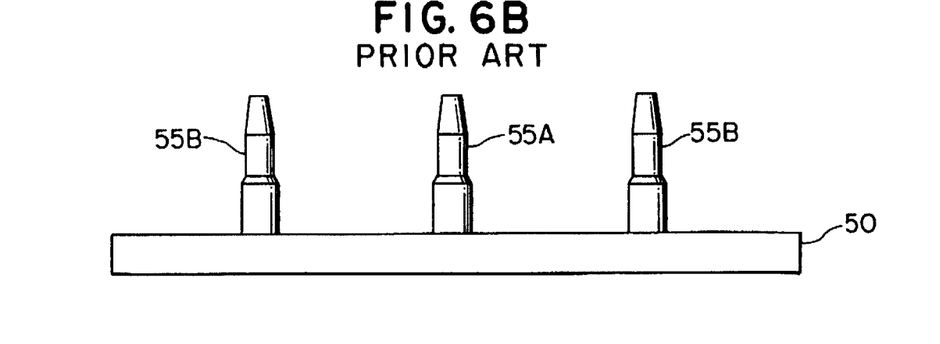
Figure 6C:
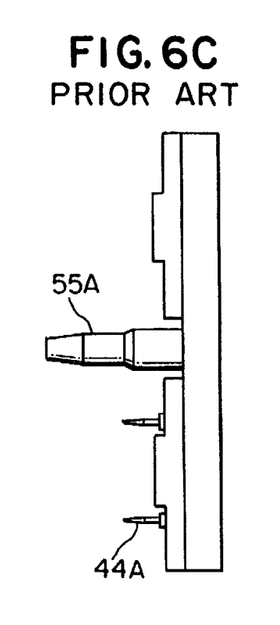

FIG. 6 is an external appearance of the measuring board 50. In FIG. 6, IC sockets 40 are arranged in correspondence with the disposition or arrangement of the IC container 20. Two guide pins 55B are provided upright on the measuring board 50 in the same line as a standard pin 55A. The standard pin 55A is inserted into the standard hole 22B of each IC container 20 while the guide pins 55B are inserted into the guide holes 22C of each IC container 20. There are defined tapered portions at the tip ends of the standard pin 55A and the guide pins 55B to facilitate the insertion of these pins into the holes. The arrangements shown in FIG. 4 through FIG. 6 are the same technically as those shown in FIG. 1 through FIG. 3 in Japanese Utility Model Application No. 05-027844.

Figure 7:
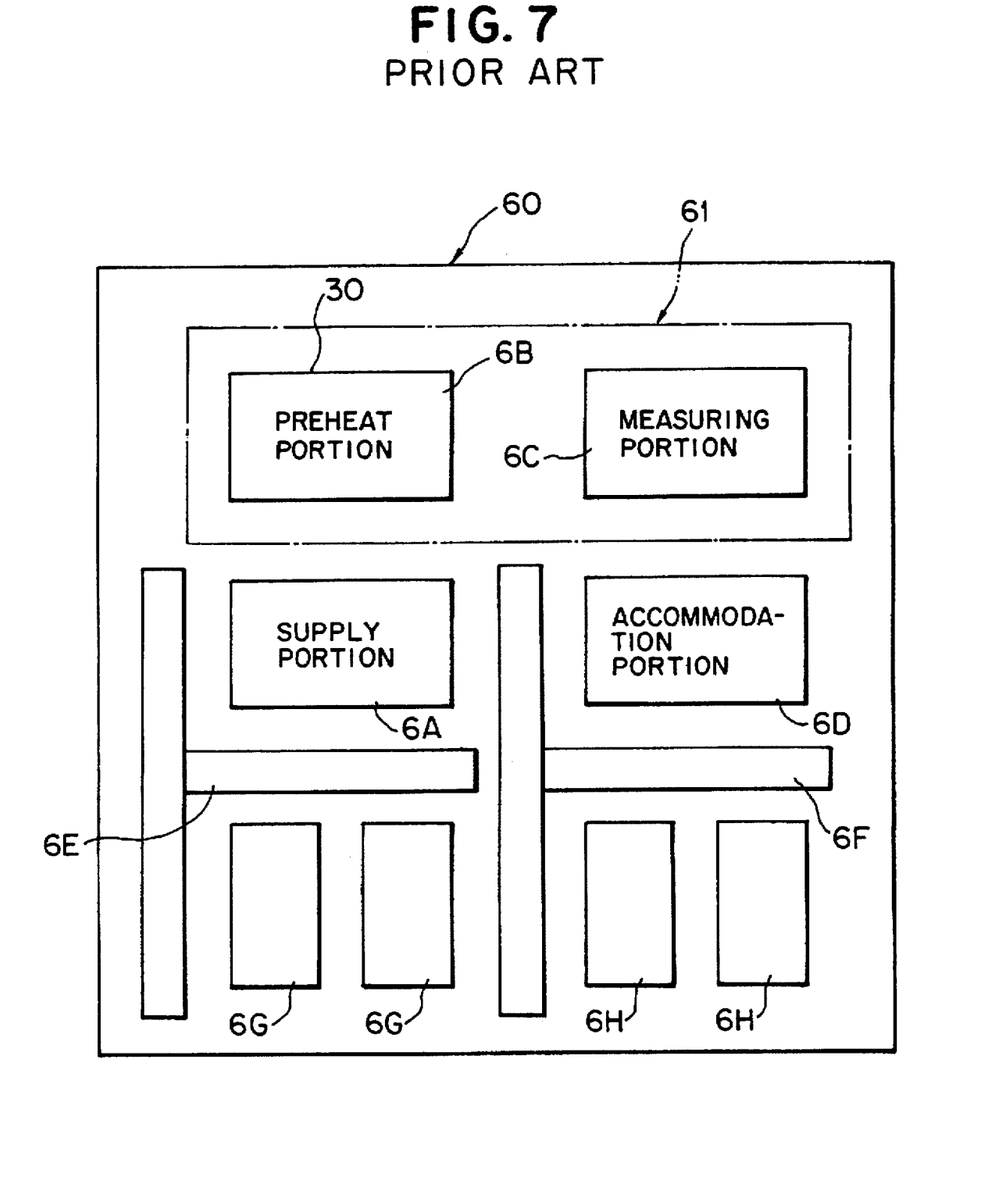
FIG. 7 is a schematic arrangement of a conventional autohandler.

A schematic arrangement of the autohandler using the IC conveyor 30 in FIG. 4 will be now described with reference to a plan view of FIG. 7. FIG. 7 shows a horizontal conveying type autohandler having a function to test ICs at high and low temperature conditions. An autohandler 60 in FIG. 7 includes a supply portion 6A, a preheat portion 6B, a measuring portion 6C and an accommodation portion 6D. The preheat portion 6B and the measuring portion 6C are respectively disposed in a constant temperature bath 61. Further, the autohandler 60 includes a supply hand 6E, an accommodation hand 6F, a supply tray 6G and an accommodation tray 6H.

An operation of the autohandler 60 will be now described with reference to FIG. 7. In FIG. 7, the IC conveyor 30 circulates in the order of the supply portion 6A→the preheat portion 6B→the measuring portion 6C→the accommodation portion 6D→the supply portion 6A.

The supply hand 6E having an attraction pad successively supplies the IC 10 inside the supply tray 6G to the IC conveyor 30 positioned at the supply portion 6A. The IC conveyor 30 accommodating therein the ICs 10 is transferred to the preheat portion 6B. In the preheat portion 6B, the IC conveyor 30 is standby until the ICs 10 in the IC conveyor 30 reach a predetermined temperature. When each of the ICs 10 reaches the predetermined temperature, the IC conveyor 30 is transferred to the measuring portion 6C where each of the ICs 10 is measured. When all ICs 10 are measured, the IC conveyor 30 is transferred to the accommodation portion 6D. The accommodation hand 6F having an attraction pad classifies and accommodates the ICs 10 in the IC conveyor 30 positioned in the accommodation portion 6D in the accommodation tray 6H depending on the result of measurement. The IC conveyor 30, which is empty, namely, free from the ICs 10, is transferred from the accommodation portion 6D to the supply portion 6A, and hence the initial operation is resumed. In such a manner, the ICs 10 are conveyed by the IC conveyor 30.

Each of the ICs 10 accommodated in the IC conveyor 30 in FIG. 4 has a lead frame. The IC 10 having the lead frame is relatively wide in an area to be grounded, and it hardly jumps out and is hardly inclined in the IC conveyor 30 during the conveyance of the IC conveyor 30.

Figure 8:
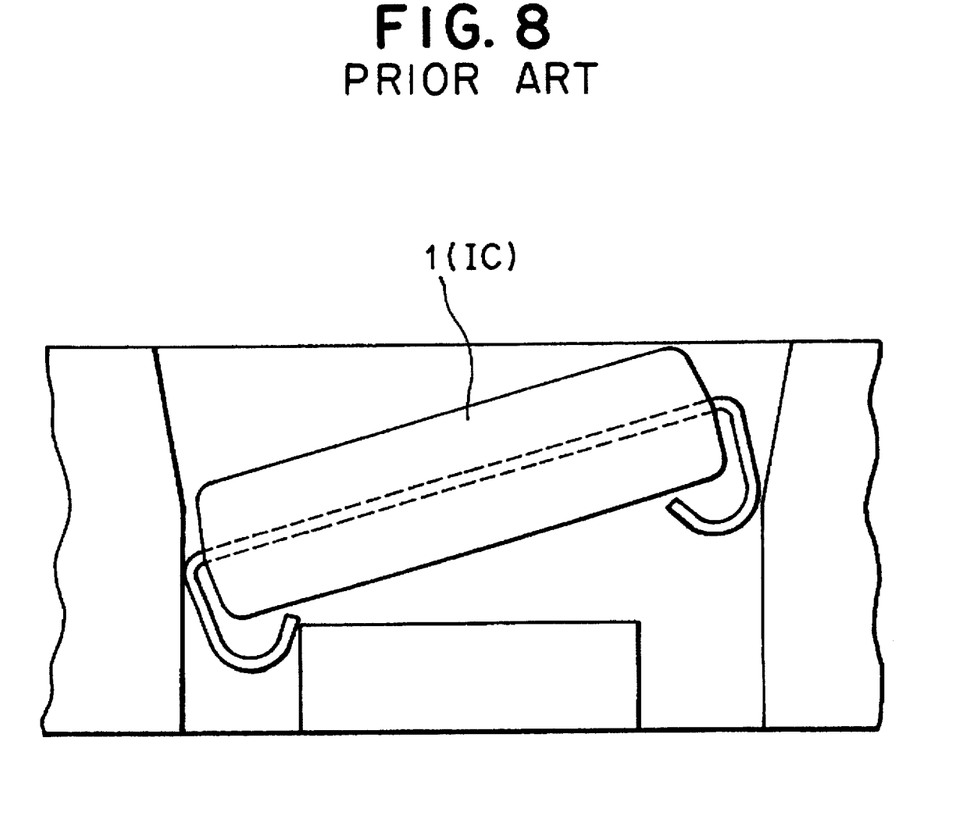
FIG. 8 is an enlarged cross sectional view showing a part of FIG. 4.

However, when flat type ICs such as SOJ type ICs are conveyed by the IC conveyor 30 as shown in FIG. 4, a posture of an IC 1 is liable to be inclined as shown in FIG. 8. The IC 1 can not be correctly measured in a state of FIG. 8.

SUMMARY OF THE INVENTION

It is an object of the present invention to provide a flat type IC conveyor having a cover thereon wherein the cover is provided with convex portions for preventing ICs from being inclined during conveyance thereof so as to stably convey the ICs.

To achieve the above object, the present invention comprises an IC conveyor tray 2 composed of a plurality of recess portions 2A arranged lengthwise and widthwise and accommodating therein flat type ICs 1, through holes 2B respectively defined in bottom surfaces of the recess portions 2A in a manner of avoiding leads of the ICs 1, and positioning pins 21 provided upright thereon, and a cover 3 composed of a plurality of fingers 3A positioned corresponding to the recess portions 2A and directed to project toward package portions of the ICs 1 to be accommodated in the recess portions 2A, and holes 3B into which positioning pins 21 are inserted, wherein the cover 3 is mounted on the IC conveyor tray 2 so that the fingers 3A can prevent the inclination of the ICs 1 in the recess portions 2A.

PREFERRED EMBODIMENT OF THE INVENTION

Figure 1A:
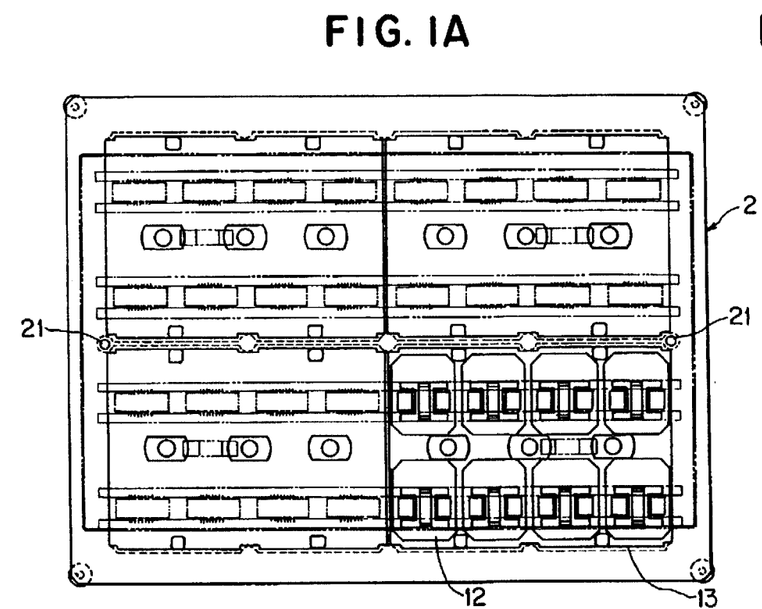
FIGS. 1A–1E show an arrangement of an IC conveyor according to a preferred embodiment of the present invention.
Figure 1B:
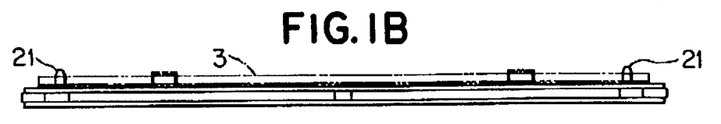
Figure 1C:
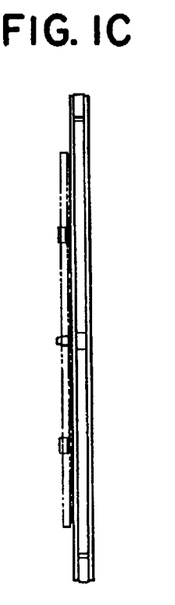
Figure 1D:
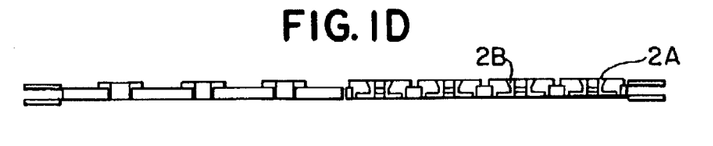
Figure 1E:
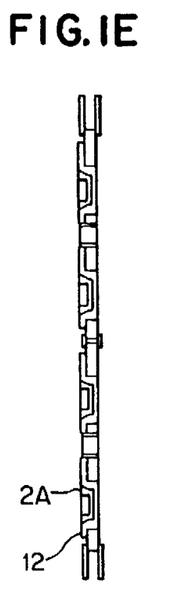

A flat type IC conveyor according to a preferred embodiment of the present invention will be now described with reference to FIG. 1 through FIG. 3. FIG. 1 shows an arrangement of an IC conveyor according to the preferred embodiment of the invention, wherein FIG. 1A is a plan view, FIG. 1B is a front view, FIG. 1C is a side view, FIG. 1D is a cross sectional view of FIG. 1B, and FIG. 1E is a cross sectional view of FIG. 1C. In FIG. 1, denoted by 2 is an IC conveyor tray, hereinafter, simply "conveyor 2," and 3 is a cover.

In FIG. 1, four IC containers 13 are disposed lengthwise and widthwise in the IC conveyor 2. Eight IC accommodation pieces 12 in which SOJ type ICs 1 are accommodated are disposed in the IC container 13. Tapered portions are formed at the openings of recess portions 2A for accommodating the ICs 1. There are defined IC containers 20 in the bottom portion of the recess portions 2A so as to avoid the leads of the ICs 1. The leads of the ICs 1 and contacts of IC sockets are connected to each other through the through holes 2B.

The IC conveyor 2 in FIG. 1 corresponds to the SOJ type ICs and has substantially the same structure as the prior art. However, the IC conveyor 2 of the present invention has positioning pins 21 for correctly positioning the ICs when the cover 3 is mounted thereon.

Figure 2A:
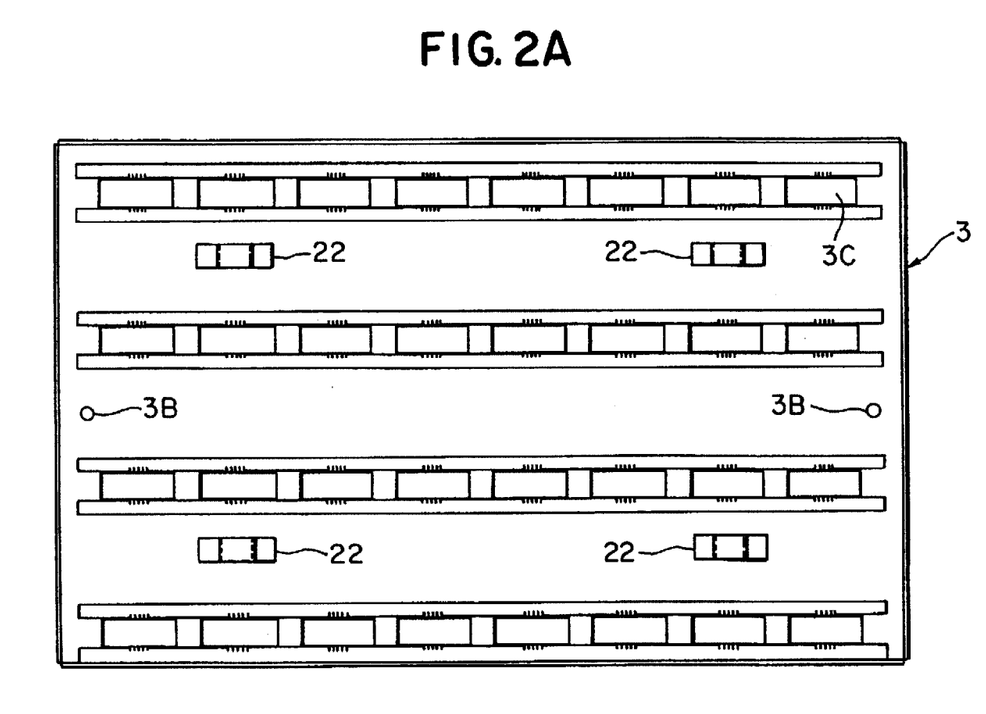
FIGS. 2A–2C show a detailed cover in FIG. 1.
Figure 2B:
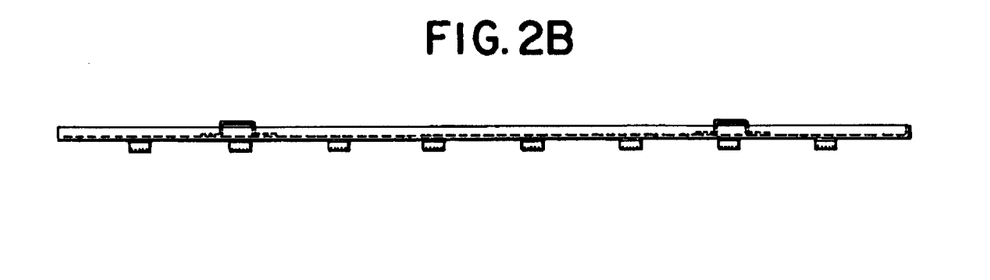
Figure 2C:
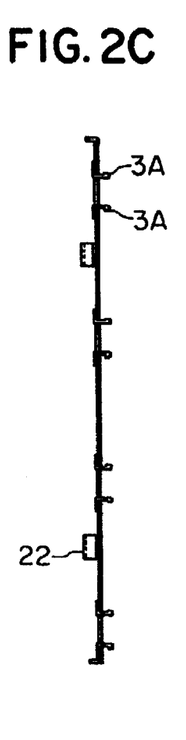

FIG. 2 shows the cover 3 in detail. The cover 3 has bosses 3A which are positioned corresponding to the recess portions 2A and which direct to project toward package portions of ICs 1 to be accommodated in the recess portions 2A. The cover 3 has holes 3B into which the positioning pins 21 of the IC conveyor 2 are inserted. Escape holes 3C for measuring pushers are defined in the bosses 3A for pushing the ICs 1 to the IC sockets.

Further, metal hooks 22 are attached to the cover 3 since the cover 3 must be attached to or detached from the IC conveyor 2 for taking the ICs 1 in or taking the ICs from the IC conveyor 2. When the cover 3 is placed or mounted on the IC conveyor 2, the ICs 1 are correctly positioned on the IC conveyor 2 by the positioning pins 21 and the holes 3B.

Figure 3:
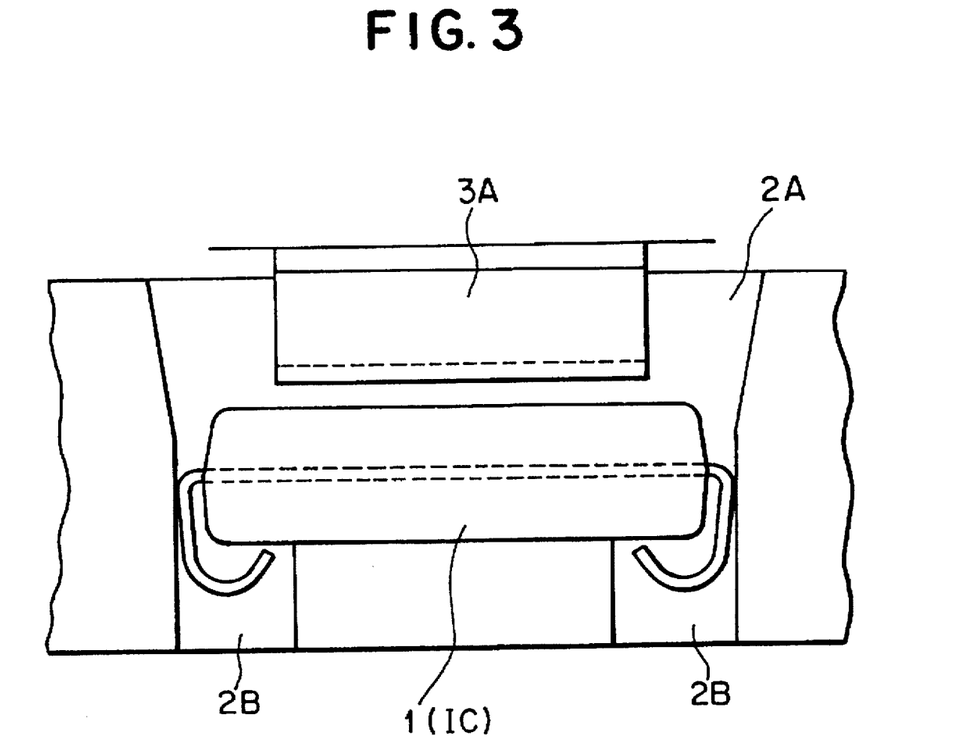
FIG. 3 is an enlarged cross sectional view showing a part of FIG. 1.

FIG. 3 is an enlarged cross sectional view of FIG. 1. As shown in FIG. 3, since the boss 3A of the cover 3 is close to a position over the package of the IC 1, the IC 1 can be stabilized in the recess portion 2A since the IC 1 is restricted in its posture by the boss 3A even if the IC 1 is forced to be jumped out or inclined in its posture.

According to the invention, the orientation of the IC can be restricted or controlled when the cover having the bosses is placed or mounted on the IC conveyor.

What is claimed is:

1. A conveyor assembly for holding packaged ICs, each IC having a generally flat package and a plurality of leads that project at an angle downward from a horizontal plane of the package, said assembly comprising:

an IC conveyor tray having opposed top and bottom surfaces, recesses formed in said top surfaces for accommodating a plurality of individual ICs therein, through holes extending from said bottom surface to said recesses for receiving the leads and positioning pins extending upwardly from said top surface; and a cover fitted over said top surface of said IC conveyor tray, said cover having holes in which said positioning pins are seated and provided with downwardly directed bosses positioned to extend into said recesses and to abut the IC packages to prevent movement of the ICs in said recesses.

2. The conveyor assembly of claim 1, wherein said bosses are formed with holes through which the IC packages are accessed.

\* \* \* \* \*